(12) United States Patent
Rossi et al.

(10) Patent No.: US 10,217,241 B2
(45) Date of Patent: Feb. 26, 2019

(54) SYSTEM AND METHOD FOR COMPRESSING GRAPHS VIA CLIQUES

(71) Applicant: Palo Alto Research Center Incorporated, Palo Alto, CA (US)

(72) Inventors: Ryan A. Rossi, Mountain View, CA (US); Rong Zhou, San Jose, CA (US)

(73) Assignee: PALO ALTO RESEARCH CENTER INCORPORATED, Palo Alto, CA (US)

(*) Notice: Subject to any disclaimer, the term of this patent is extended or adjusted under 35 U.S.C. 154(b) by 294 days.

(21) Appl. No.: 15/183,561

(22) Filed: Jun. 15, 2016

(65) Prior Publication Data
US 2017/0365071 A1 Dec. 21, 2017

(51) Int. Cl.
| | |
|---|---|
| *G06F 17/30* | (2006.01) |
| *G06T 9/20* | (2006.01) |
| *G06T 11/20* | (2006.01) |
| *H03M 7/30* | (2006.01) |

(52) U.S. Cl.
CPC ............ *G06T 9/20* (2013.01); *G06T 11/206* (2013.01); *H03M 7/30* (2013.01); *G06F 17/30958* (2013.01); *H03M 7/3059* (2013.01); *H03M 7/70* (2013.01)

(58) Field of Classification Search
CPC ....................................................... G06F 17/30
USPC ........................................................ 707/798
See application file for complete search history.

(56) References Cited

U.S. PATENT DOCUMENTS

| | | | | |
|---|---|---|---|---|
| 6,792,414 B2* | 9/2004 | Chaudhuri | .......... | G06F 17/3033 |
| 6,801,904 B2* | 10/2004 | Chaudhuri | .......... | G06F 17/3033 |
| 7,010,520 B2* | 3/2006 | Agrawal | .......... | G06F 17/30864 |
| 8,200,596 B2* | 6/2012 | Andersen | ................ | G06F 17/10 |
| | | | | 706/45 |
| 8,650,647 B1* | 2/2014 | Nachenberg | .......... | G06F 21/577 |
| | | | | 706/10 |
| 8,874,477 B2* | 10/2014 | Hoffberg | ............ | G06Q 10/0631 |
| | | | | 705/37 |
| 2017/0109907 A1* | 4/2017 | Hamedani | .......... | G06F 17/30486 |
| 2017/0212966 A1* | 7/2017 | Hamedani | .......... | G06F 17/30486 |
| 2017/0365071 A1* | 12/2017 | Rossi | ........................ | G06T 9/20 |

* cited by examiner

*Primary Examiner* — Kim T Nguyen
(74) *Attorney, Agent, or Firm* — Shun Yao; Park, Vaughan, Fleming & Dowler LLP

(57) ABSTRACT

Embodiments of the present invention provide a system for fast parallel graph compression based on identifying a set of large cliques, which is used to encode the graph. The system provides both permanently-stored and in-memory graph encoding and reduces the space needed to represent and store a graph, the I/O traffic to use the graph, and the computation needed to perform algorithms involving the graph. The system thereby improves computing technology and graph computation. During operation, the system obtains data indicating vertices and edges of a graph. The system executes a clique-finding method to identify a maximum clique in the graph. The system then removes the clique from the graph, adds the clique to a set of found cliques, and generates a compressed representation of the graph based on the set of found cliques.

18 Claims, 8 Drawing Sheets

SYSTEM AND METHOD FOR COMPRESSING GRAPHS VIA CLIQUES

BACKGROUND

Field

The present disclosure relates to graph compression. More specifically, this disclosure relates to a method and system for encoding graphs by finding and removing large cliques in order to reduce computational time and storage requirements.

Related Art

Graphs are representations of edges, also known as links or connections, that connect a set of vertices, also known as nodes. Graphs are important for many applications, including in the analysis of large data sets such as social networks or consumer-product relationships, and in biology and computer science. Many graph-computation methods exist, including for predicting relationships and making recommendations.

Because of the importance of graphs, numerous methods exist to represent and store graphs in computerized storage, such as in disk or memory. A number of methods also exist to compress representations of graphs. For example, the Edge-based Compressed Sparse Column (ECSC) format makes use of a compressed representation of a matrix storing the edges of a graph. The ECSC format is based on the Compressed Sparse Column (CSC) format for storing a sparse matrix, also known as Compressed Column Storage (CCS). These formats take advantage of matrix sparsity by encoding non-zero elements, while avoiding storing zeros.

Such techniques for compressing graphs have become increasingly important, yet graph compression remains a fundamentally challenging and unsolved problem. For example, parallel computing architectures such as the GPU have limited memory and are thus typically unable to handle large graphs. In addition, GPU algorithms must be designed with this limitation in mind, and in many cases, may be required to perform significantly more computations, in order to avoid using additional memory.

A number of methods have also been developed to identify cliques in a graph. A clique is a fully-connected subgraph, or subset of the vertices, of a graph. Clique-finding methods include greedy algorithms, branch-and-bound algorithms, and dynamic programming. In general, clique-finding is known to be a difficult problem that is hard to approximate, and therefore may take considerable computational time.

SUMMARY

One embodiment of the present invention provides a system and method for generating a compressed representation of a graph. During operation, the system stores a data structure indicating vertices and edges of a graph. The system may identify a maximum clique in the graph. The maximum clique is a largest remaining fully-connected subset of vertices in the graph or an approximation to the largest remaining clique (such as a large remaining clique, or a large set of vertices that is nearly a clique). The system may then add the identified clique to a set of found cliques. The system may remove the identified clique from the graph. Responsive to determining that the size of the identified maximum clique is below a stopping criterion or that no vertices remain in the graph, the system may then order the cliques in the set of found cliques and a set of vertices belonging to the cliques, generate a compressed representation of the graph based on the ordered set of found cliques and the ordered set of vertices, and store the compressed representation of the graph.

In a variation on this embodiment, the system may replace, in the graph, a respective clique in the set of found cliques with a clique pseudo-vertex.

In a variation on this embodiment, a first subset of vertices belonging to a first respective clique may be contiguously ordered, and a second subset of vertices belonging to a second respective clique may be ordered after the first subset of vertices if the second respective clique is ordered after the first respective clique in the ordered set of cliques. The system may then, for a respective clique in the ordered set of cliques, encode an ordering index associated with a first-ordered vertex in a respective subset of vertices belonging to the respective clique.

In a variation on this embodiment, the system may order the vertices in the graph based on a k-core degeneracy value. The system may then choose, based on the ordering, a first respective vertex. The system may choose a neighboring vertex connected to the first vertex. The system may add the first and neighboring vertices to a candidate maximum clique.

In a variation on this embodiment, the system may perform a first part of a graph-traversal or social-network computation, wherein the graph-traversal or social-network computation requires checking whether a first vertex and a second vertex are connected. The system may then check whether the first vertex and the second vertex are connected, which further comprises determining whether an ordering index for the first vertex and an ordering index for the second vertex fall within a same subset of vertices belonging to a respective clique. The system may then perform, based on a result of checking whether the first vertex and the second vertex are connected, a second part of the graph-traversal or social-network computation. The system may then generate, based on the graph-traversal or social-network computation, a recommendation for a user.

In a variation on this embodiment, the system may generate independent sets of vertices such that two respective vertices belonging to a same independent set have no common neighbors. The system may then order the independent sets of vertices such that a first independent set maximizes a degree function. The system may then assign a respective vertex from the first independent set to a respective processor. The respective processor may then choose a neighboring vertex connected to the respective vertex. The respective processor may then add the first and neighboring vertices to a candidate maximum clique.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention solve the problem of performing fast parallel graph compression by identifying large cliques, which are then used to encode the graph. The system may also provide exact, as well as fast heuristic, clique-finding methods. These methods have been observed by the inventors to scale in runtime roughly linearly in graph size over multiple real-world graphs with as many as 100 million nodes. During operation, the system obtains data indicating vertices and edges of a graph. The system executes a clique-finding method to identify a maximum clique in the graph. The system then removes the clique from the graph, adds the clique to a set of found cliques, and generates a compressed representation of the graph based on the set of found cliques.

The system improves computing technology and a computer's ability to perform arbitrary computations involving graphs. The system and methods disclosed herein can significantly improve the computational speed of graph primitive operations used in virtually all graph computations, thereby improving graph computations generally. Likewise, because the system may represent graphs compactly, it can improve caching, and considerably improve overall performance of graph computations. Additionally, it may reduce input/output costs, for example from CPU to GPU. There are many applications and advantages of such graph compression techniques. For example, the system could improve the ability of parallel computing architectures such as the GPU to store and handle significantly larger graph computations, or could improve the visualization of graph data.

Figure 1A:
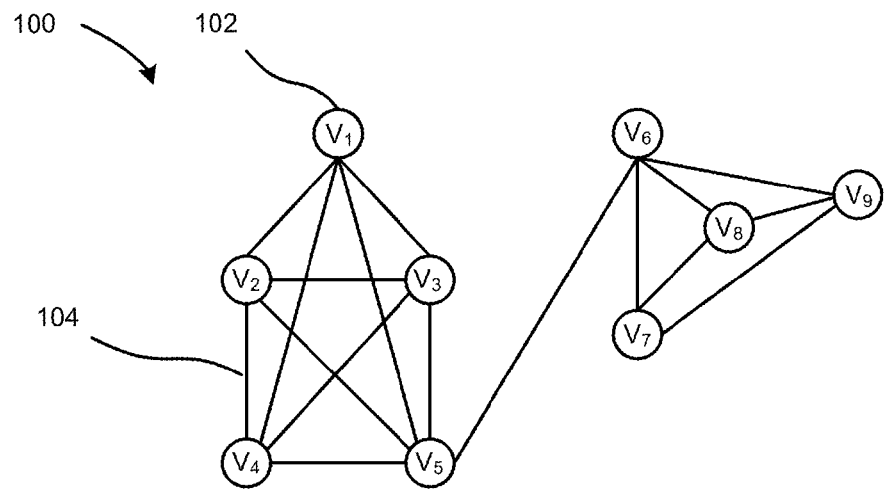
FIG. 1A illustrates an example of a graph containing cliques.
Figure 1B:
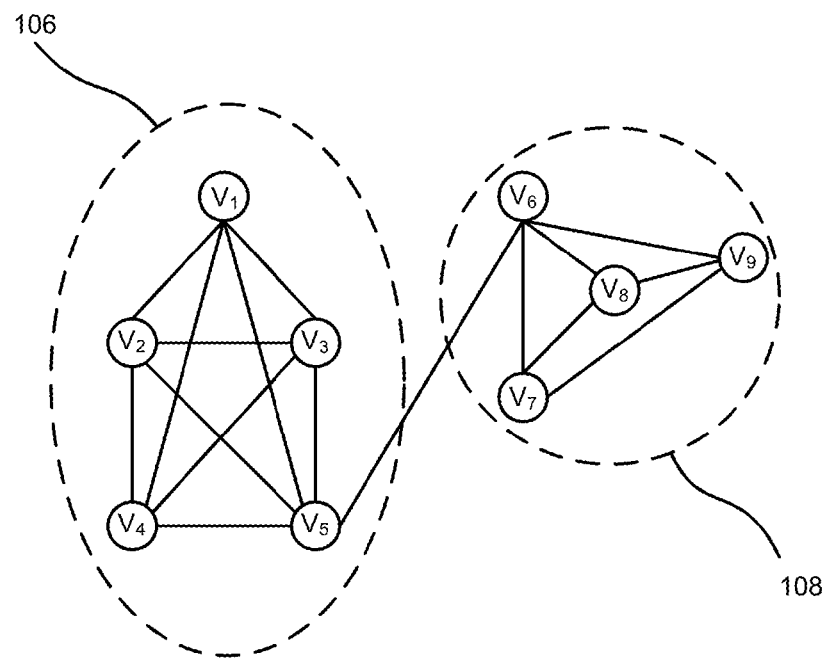
FIG. 1B presents an identification of two cliques in the graph of FIG. 1A.

FIG. 1A illustrates an example of a graph containing cliques. As illustrated, a graph 100 can include vertices such as 102, also called nodes, and edges such as 104, also called links or connections. FIG. 1B presents an identification of two cliques in graph 100. A clique is defined as a subset of vertices in a graph that is fully connected. That is, each vertex in a clique has an edge to every other vertex in the clique, as shown in FIG. 1B for the two cliques 106 and 108 in graph 100. Embodiments of the present invention provide a graph compression and encoding framework called GraphZIP based on the observation that real-world graphs often form many cliques of a large size. The system provides both permanently-stored and in-memory graph encoding and reduces the space needed to represent and store a graph, the I/O traffic to use the graph, and the computation needed to perform algorithms involving the graph.

System Architecture

Figure 2:
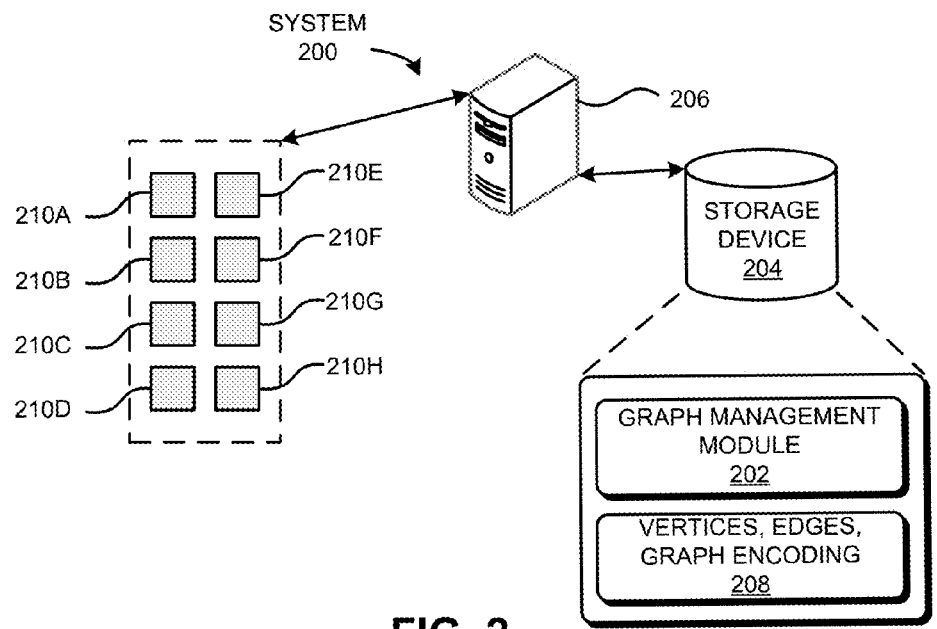
FIG. 2 presents a block diagram illustrating an exemplary architecture of a graph computation system utilizing the graph compression method, according to some embodiments.

FIG. 2 presents a block diagram illustrating an exemplary architecture of a graph computation system 200 utilizing the graph compression method, according to an embodiment. Graph computation system 200 may divide the vertices of a graph and perform compression or other computations on an encoded graph, using multiple processors. Graph computation system 200 may perform graph primitive operations to facilitate various applications such as generating recommendations. In standard systems, system 200 would store all the vertices and edges of the graph. However, using the methods disclosed herein, system 200 makes use of a compressed representation of the graph, thereby improving storage and performance.

Graph computation system 200 may include a graph management module 202 installed on a storage device 204 coupled to a server 206. Note that various implementations of the present invention may include any number of servers and storage devices. In various implementations, graph management module 202 may include a graph-encoding module or other components of graph computation system 200 to perform the techniques described herein. System 200 may receive data describing vertices and edges, or graph encodings, and store such data in storage device 204. System 200 may read the code for graph management module 202 and the data for vertices, edges, and graph encodings 208 from storage device 204. System 200 may dynamically divide vertices, subgraphs, or computations and assign them to processors, such as processors 210A-210H, which operate on the assigned vertices, subgraphs, or computations.

Storage-and Computation-Saving Features

Figure 3:
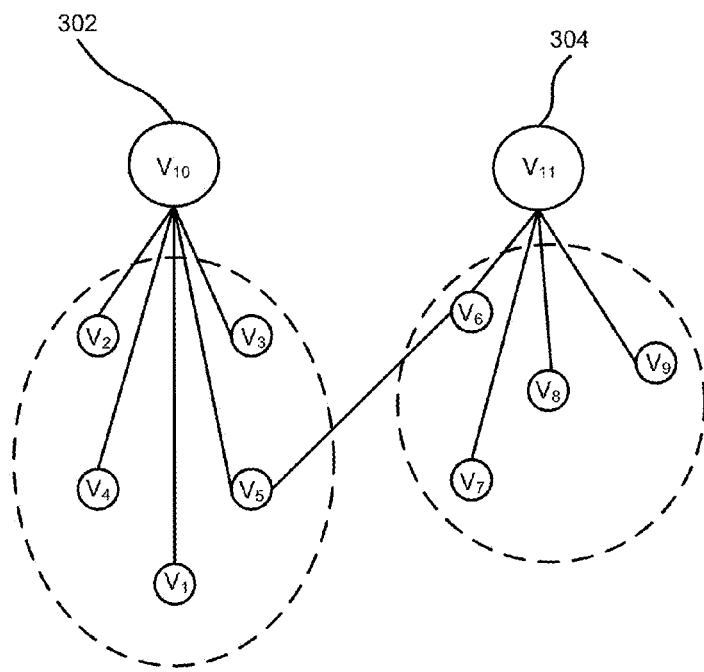
FIG. 3 illustrates an encoding, according to some embodiments of the present invention, of the two cliques identified in FIG. 1B.

FIG. 3 illustrates an encoding, according to some embodiments of the present invention, of the two cliques identified in FIG. 1B. In embodiments of the present invention, the system significantly reduces the amount of space needed to store a graph either in memory or in permanent storage by removing cliques from the graph. For example, the system may represent a graph by re-ordering vertices such that all vertices belonging to a respective clique C are contiguously ordered. Moreover, in some embodiments, the system may store the cliques separately, for example as a set of pseudo-vertices representing cliques that may be ordered at the end of the ordering of vertices in the graph. This is illustrated schematically in FIG. 3, where the clique pseudo-vertices 302 and 304 represent the cliques 106 and 108, respectively, from FIG. 1B.

Then the real vertices may be ordered such that respective subsets of real vertices belonging to respective cliques $C_1$ and $C_2$ match the ordering of pseudo-vertices representing cliques $C_1$ and $C_2$. For example, if $C_1$ and $C_2$ are the first two cliques in the ordering of pseudo-vertices, then the first vertices in the ordering will be $(v_1, \ldots v_k) \in C_1$, followed by $(v_{k+1}, \ldots v_{k+m}) \in C_2$, where $k=|C_1|$ and $m=|C_2|$. This is illustrated in FIG. 3, where vertices $(v_1, \ldots v_5)$ are associated with pseudo-vertex 302 representing clique 106, and vertices $(v_6, \ldots v_9)$ are associated with pseudo-vertex 304 representing clique 108. In these embodiments, it is no longer necessary to represent the edges within a clique because a clique is known, by definition, to be fully connected.

It is also unnecessary in these embodiments to represent the individual vertices in a clique. Instead, the system may simply represent the range of vertex indices associated with a clique, for example all indices from 1 to k are associated with clique $C_1$. This is illustrated by Table 1, which represents an encoding for graph 100 and cliques 106 and 108. Because real graphs tend to have many large cliques, such a representation saves significant storage and memory, as can be seen from the Table.

Likewise, virtually all computations performed on graphs make use of elementary operations known as graph primitives. The present system and methods can significantly reduce the computational complexity of such graph primitives, therefore speeding them up. By doing so, the system can significantly speed up the overall graph computations.

TABLE 1

Exemplary graph representations for graph 100 shown in FIG. 1A, without compression, and with compression according to embodiments of the present invention.

| Row | Uncompressed Edge List Representation | Compressed Representation |
| --- | --- | --- |
| 1 | 1 ↔ 2 | 1, 6, 10 |
| 2 | 1 ↔ 3 | 5 ↔ 6 |
| 3 | 1 ↔ 4 | |
| 4 | 1 ↔ 5 | |
| 5 | 2 ↔ 3 | |
| 6 | 2 ↔ 4 | |
| 7 | 2 ↔ 5 | |
| 8 | 3 ↔ 4 | |
| 9 | 3 ↔ 5 | |
| 10 | 4 ↔ 5 | |
| 11 | 5 ↔ 6 | |
| 12 | 6 ↔ 7 | |
| 13 | 6 ↔ 8 | |
| 14 | 6 ↔ 9 | |
| 15 | 7 ↔ 8 | |
| 16 | 7 ↔ 9 | |
| 17 | 8 ↔ 9 | |

For example, checking whether a vertex belongs to a given clique C could take time logarithmic in the size of the clique, that is O(log|C|), by performing a binary search throughout the clique. In embodiments of the present invention, the same search could take constant time, that is O(1), by simply checking whether the index of the vertex in a compressed encoding according to the disclosed methods falls within a range associated with the clique C. For example, to check whether vertex $v_3$ belongs to clique 106, it would suffice to check the first row of the compressed representation in Table 1. As Table 1 shows, 1 is the first vertex index belonging to the first clique 106 in graph 100, and 6 is the first index of the second clique 108 in graph 100, so all vertices with indices ranging from 1 through 5 belong to clique 106. Therefore, vertex $v_3$ with index 3 belongs to clique 106.

Likewise, because the system may represent a graph and its cliques more compactly and efficiently, it can improve caching and performance in general. For example, graph primitives such as checking whether two vertices are connected must be frequently performed. Therefore, an encoding of a clique compressed according to embodiments of the present invention, or similar information, could be stored in a cache memory. In particular, highly efficient representations of a clique, such as the one shown in the right-hand column of Table 1, may be cached. By improving caching performance, the system may considerably improve overall performance of graph computations. Additionally, input/output costs, for example from a CPU to a GPU, may also be reduced.

There are many applications and advantages of such graph compression techniques. For instance, parallel computing architectures such as the GPU have limited memory and therefore could handle significantly larger graphs with the methods disclosed herein. Very importantly, the method is efficient for big data and easily parallelized for both shared and distributed memory architectures. The graph compression method is extremely scalable for massive data with billions or more edges, and easily adapted for implementation on CPUs, GPUs, and distributed architectures.

This method may also benefit applications such as recommendation systems, link prediction, correlation analysis, graph/data clustering and role discovery, etc. The method also has a variety of applications beyond the time and space improvements described above. For instance, one may use this method to visualize graph data better, as the large cliques can be combined to reveal other important structural properties.

Generalized ECSC Representation

In embodiments of the present invention, the system may make use of a generalized Edge-based Compressed Sparse Column (ECSC) encoding. The encoding is generalized because, unlike the traditional ECSC encoding, it contains pseudo-vertices representing cliques in the original graph.

A traditional graph encoding as a matrix is indexed by the vertex indices, with elements of 1 indicating an edge between the vertices indexed by the row and column numbers, and zeros representing no such edge. In this matrix encoding, the diagonals are zero and the matrix is, of course, symmetric. The traditional ECSC encoding applies compressed sparse column (CSC) matrix encoding to this graph matrix. CSC encodes the locations of nonzero matrix elements by encoding a row index for each such element in a row index array, and a column pointer array holding an index of each element in the row index array that begins a new column.

The ECSC encoding includes an array of neighbors encoded as described above. It also includes an edge ID array, a non-unique edge-indexed array (from the neighbor array). Duplicate edges in the neighbor array are assigned a unique edge ID that acts as a pointer into an edge map array. This provides two important features. First, note that the edge ID is a subjective function that maps duplicate edges from CSC to their unique position in the edge map array. In addition, the edge ID also points to the edge map array where the vertices of a specific edge are consecutively stored and can be accessed in O(1) time. This function provides the flexibility of using CSC while also giving random access to unique edges and their vertices in O(1). Note that Edge-CSC is efficient to construct, taking O(|E|) time, where |E| is the number of edges (when reading from disk or from CSC).

In embodiments of the present invention, the system may make use of a generalized ECSC encoding. In the generalized ECSC, a new vertex type may be introduced, called a clique pseudo-vertex, or clique vertex. Intuitively, a clique vertex represents a clique C in a graph G. The system may use an ordering of the cliques and vertices, wherein the minimum index (or ID) of a clique vertex (clique pseudo-vertex) starts from $v_{n+1}$, where $v_n$ is the maximum ID of any real vertex. That is, the set of vertices in the graph is $V=\{v_1, \ldots v_n, v_{n+1}, \ldots \}$ where $v_1$ through $v_n$ are real vertices and $v_{n+1}$ and all subsequent vertices in the ordering are clique vertices. This way, as long as the algorithm knows the index n, it can quickly determine if a vertex is a clique vertex or not. In the latter case, the successor iterator would look up the definition of the clique and subsequently iterate over all the nodes in that clique for the correct successor generation. If a neighbor of a normal vertex is a clique-vertex, then the iterator must retrieve the neighbors of the clique vertex.

The above-described generalized ECSC encoding includes the original ECSC representation as a special case, that is, if no clique (and thus no pseudo vertex) exists in the graph. However, if one or more cliques exist, then the proposed clique compression technique is guaranteed to reduce the space needed to store the graph.

Figure 4:
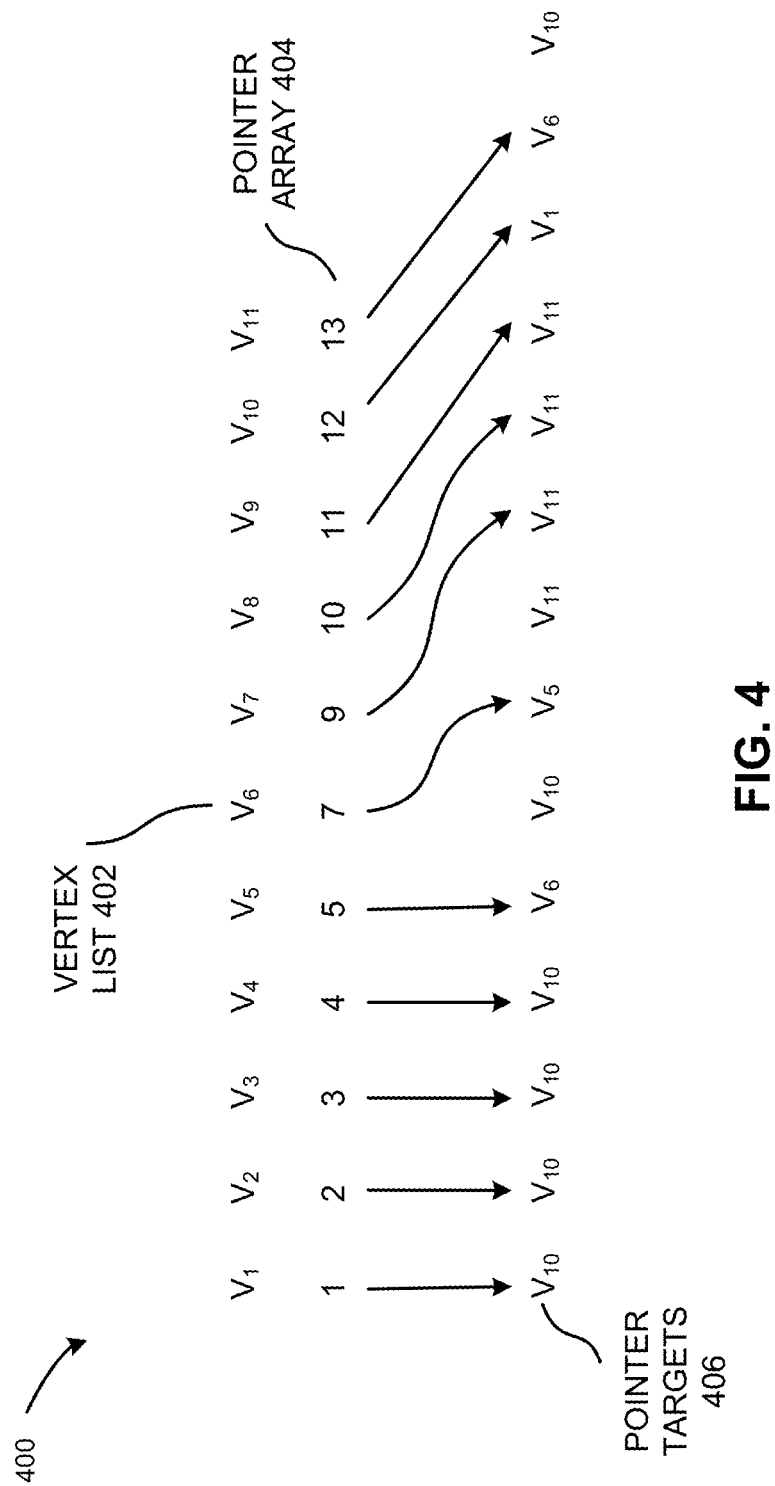
FIG. 4 presents an exemplary encoding of vertices and cliques in the graph of FIG. 1A according to embodiments of the present invention.

FIG. 4 presents an exemplary encoding 400 of vertices and cliques in graph 100 by the generalized ECSC representation, according to embodiments of the present invention. FIG. 4 illustrates in greater detail the intuitive encoding shown in FIG. 3. As shown by vertex list 402 in the first row of FIG. 4, the system may use an encoding with nine real vertices, ($v_1, \ldots v_9$), to represent the nine vertices in graph 100. The encoding 402 moreover contains two clique pseudo-vertices, $v_{10}$ and $v_{11}$, which represent cliques 106 and 108, respectively.

The next row of FIG. 4 represents pointer array 404, which indicates, for each vertex in list 402, an index of a neighboring vertex in an array 406 of pointer targets. Therefore, the exemplary encoding must store a total of 11 pointers, for the nine real vertices and two pseudo-vertices used to encode graph 100.

Finally, the bottom row of FIG. 4 illustrates the array of pointer targets 406, which represent real or pseudo-vertices associated with the vertices in list 402 by the encoding in embodiments of the invention. As can be seen in FIG. 4, real vertices ($v_1, \ldots v_4$) are associated by the encoding with clique pseudo-vertex $v_{10}$, which represents clique 106. Real vertex $v_5$ is associated with real vertex $v_6$, which belongs to clique 108, and likewise, vertex $v_6$ is associated with vertex $v_5$. Real vertices ($v_7$, $v_8$, $v_9$) are associated by the encoding with clique pseudo-vertex $v_{11}$, which represents clique 108. Finally, clique pseudo-vertices $v_{10}$ and $v_{11}$ are associated with $v_1$ and $v_6$, the first-ordered real vertices contained in the respective cliques 106 and 108. Note that the final entry in pointer targets array 406 is $v_{10}$, the first-ordered vertex after those contained in clique 108.

Method for Compressing a Graph

Figure 5:
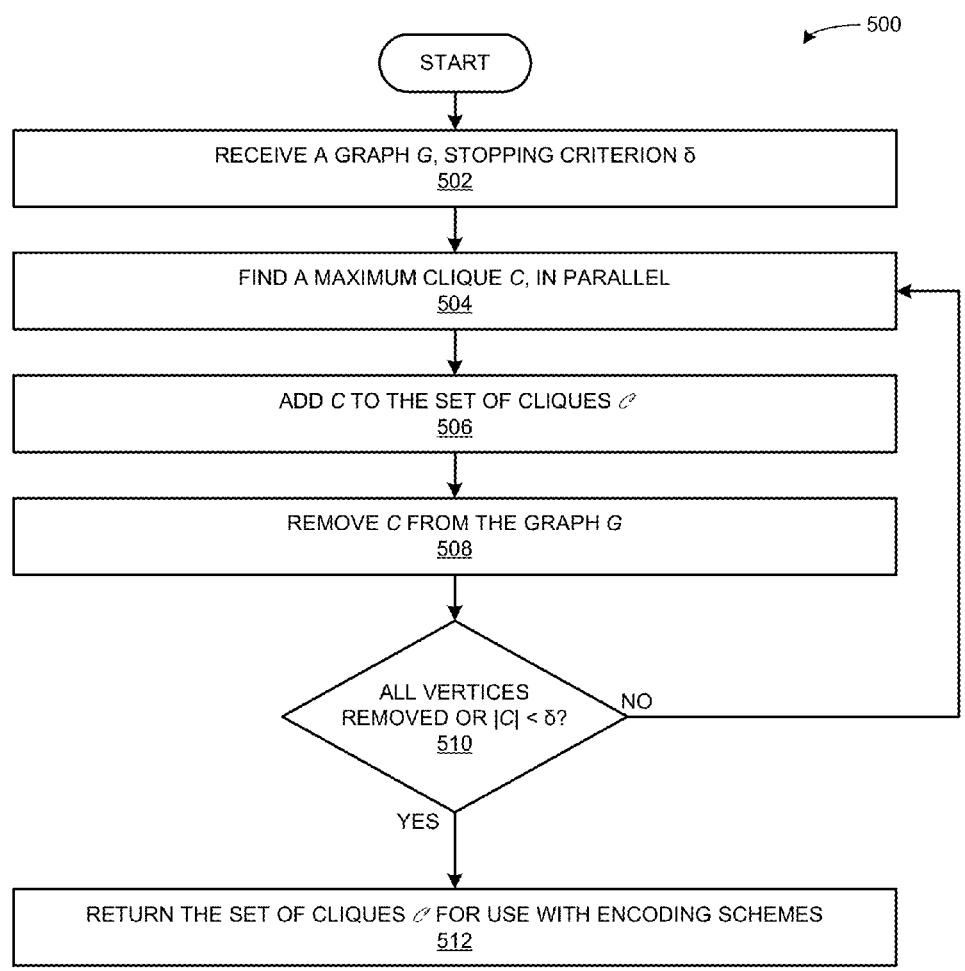
FIG. 5 presents a block diagram illustrating a method for compressing a graph according to embodiments of the present invention.

FIG. 5 presents a flowchart 500 illustrating a method to compress a graph according to embodiments of the present invention. During operation, the system obtains graph data indicating vertices and edges of a graph and a stopping criterion (operation 502). The system then executes a clique-finding method to find a maximum clique (operation 504). A maximum clique is defined as the largest remaining clique in the graph or an approximation to the largest remaining clique. An approximation to the largest remaining clique may be a large remaining clique, or may be a large set of vertices that is nearly a clique (i.e., a densely-connected set of vertices that is missing a small proportion of edges needed to be fully-connected).

In some embodiments, the clique-finding method may be exact, locating an exact maximum clique in a given graph. In some embodiments, the clique-finding method may be approximate or heuristic. Given a graph as input, the clique-finding method may return an exact, approximate, or heuristic maximum clique as output. In embodiments providing an exact clique-finding method, the system may provide lossless compression of the graph, but this generally has a higher computational cost. In embodiments providing a heuristic clique-finding method, the system may provide compression with some loss, which generally has a lower computational cost. In embodiments providing exact clique-finding, the system may also provide a better compression ratio because, for example, the system may find and remove larger cliques.

Next, the system may add the found maximum clique to a set of found cliques (operation 506). The set of found cliques may encode labels for the cliques found so far by the system. The system may also keep track of vertices belonging to the found cliques. In some embodiments, the system may reorder the vertices of the graph. For example, the system may reorder the vertices belonging to the found cliques to match an ordering of the found cliques.

In some embodiments, the system may then remove the found maximum clique from the graph (operation 508). The system may check whether all vertices have been removed from the graph, or whether the found maximum clique is smaller than the stopping criterion δ (operation 510). If so, the system may return the set of found cliques and the vertices belonging to the found cliques for use with encoding schemes (operation 512). If vertices remain in the graph and the found maximum clique is at least as large as the stopping criterion, the system may return to operation 504. That is, the system may execute a clique-finding method to find a subsequent maximum clique (an exact or approximate largest remaining clique after removing the previously-found clique from the graph).

The stopping criterion δ is a number that is compared to the size of a found clique to determine whether the clique is large enough to provide significant compression. In general, the larger a clique, the more compression provided by removing the clique and/or encoding it according to embodiments of the present invention. Cliques of size |C|>2 are beneficial as they may reduce space and input/output costs and improve performance of graph computations, and thus, the system may require cliques to be of size |C|=3 and above. Equivalently, the system may set the stopping criterion δ to at least 3. The stopping criterion δ may also provide a balance between compression of the graph and computational cost of compression method 500. In general, the largest cliques in the graph will provide the most compression. Thus, setting δ small will provide additional compression at additional computational cost of method 500.

Figure 6:
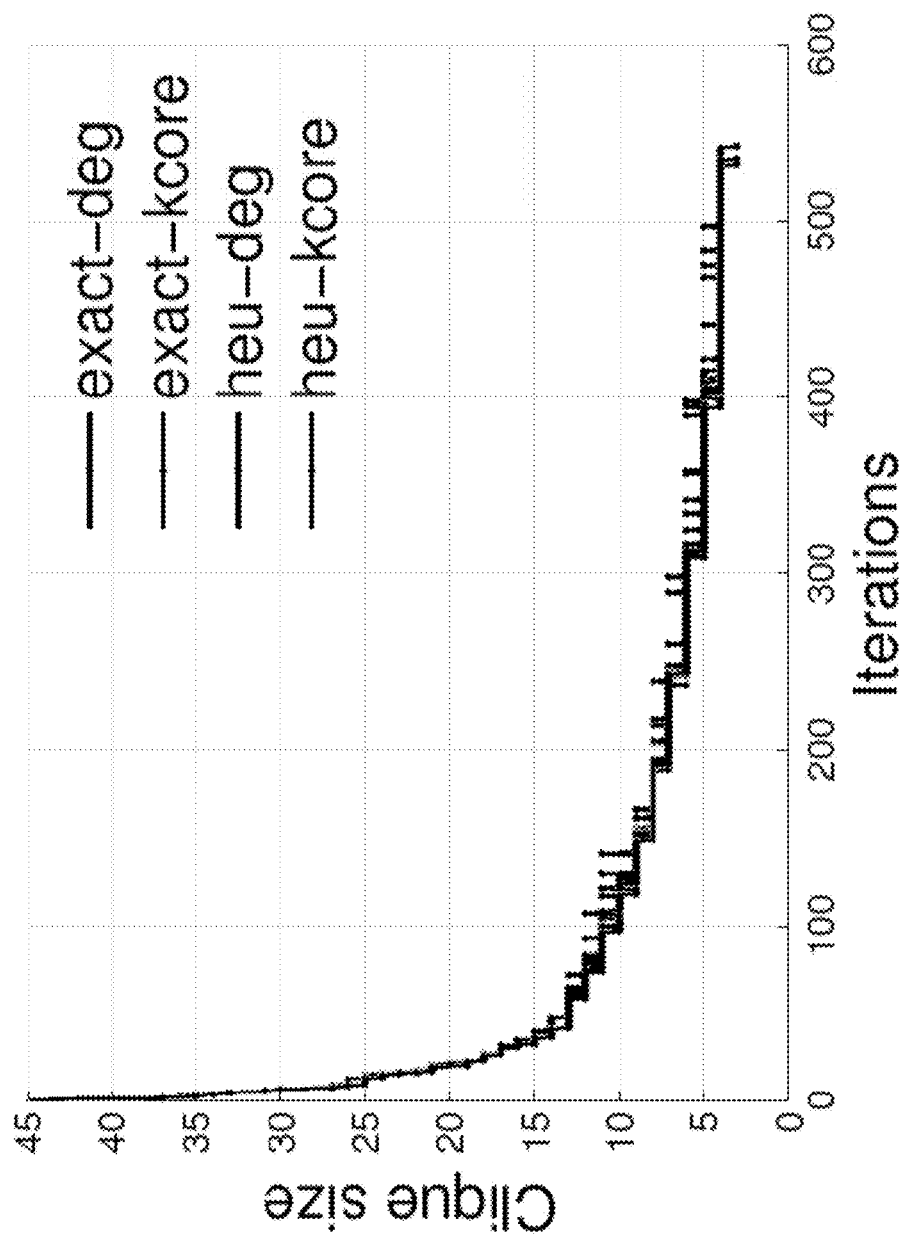
FIG. 6 illustrates clique identification in an actual data set according to embodiments of the present invention.

FIG. 6 illustrates clique identification in an actual data set according to embodiments of the present invention. The figure presents size of found cliques vs. number of iterations of method 400 for several heuristic and exact clique-finding methods executed on real graph data by the inventors. In experiments, the inventors also observed the heuristic clique-finding methods to find the same maximum clique size as the exact methods in more than half the graphs. Moreover, the inventors observed the heuristic methods to provide good compression 2-3 times faster than the exact ones. The inventors observed the system to be effective for compressing both large sparse graphs as well as dense graphs.

Note that if two cliques overlap significantly, then there is little benefit to using both in the compressed encoding. However, allowing cliques that overlap with only a few vertices may allow further reductions in space, at the expense of additional computational costs to find these cliques and ensure that there is not significant overlap. Therefore, instead of entirely removing found cliques as in step 508 of method 500, in some embodiments, the system may use an overlap threshold fraction θ, to determine whether cliques overlap more than an allowed amount. In some embodiments, the system may compare a scoring function to θ to determine whether overlapping cliques are allowed. For example, a scoring function such as $|C_1 \cap C_2|/|C_1 \cup C_2|$ may be compared against θ.

Method for Finding Cliques

The clique-finding method executed in step 504 may be exact, approximate, or heuristic. In some embodiments, the method may order vertices based on a k-core number or degeneracy associated with the graph or a subgraph, or based on a k-coloring. In some embodiments, the system may obtain independent sets from a greedy coloring or a neighborhood or distance-two coloring. In some embodiments, the exact clique-finding method is a branch-and-bound method using an initial guess for the maximum clique, which may come from a heuristic method.

In some embodiments, the heuristic clique-finding method proceeds by obtaining k-core numbers for the vertices in the graph, and stepping through the graph vertices in order of decreasing k-core number. If a respective vertex has a sufficiently large core number, the system may form a candidate clique including the respective vertex. The system may search for the candidate clique by examining the neighbors of the respective vertex and identifying those neighbors with sufficiently large core numbers. In some embodiments, the system may determine whether a vertex or its neighbors have a sufficiently large k-core number by determining whether the core number exceeds the size of the largest clique found so far, or of another candidate clique.

The system may step through neighbors with sufficiently large core numbers and add a respective neighbor to the candidate clique if the respective neighbor is connected to all the vertices in the candidate clique (i.e., if the candidate clique remains a clique with the addition of the respective neighbor). After stepping through the neighbors, the system may then add the candidate clique to a set of found cliques. The system may also designate the candidate clique as the maximum clique if its size exceeds the largest clique found so far.

In some embodiments, the exact clique-finding method proceeds by computing k-core numbers for the vertices in the graph. The system may then use a heuristic clique-finding method as described above to identify an approximate maximum clique in the graph. The system may then remove from the graph vertices with core numbers smaller than the size of the approximate maximum clique. The system may then identify a vertex with smallest reduced degree remaining in the graph. The reduced degree of a vertex refers to the degree of the vertex after any other pruned vertices have been removed. The system may perform a branching method based on the identified vertex, which may result in growing the candidate maximum clique. The system may then remove the identified vertex from the graph or mark them as pruned, and may periodically explicitly remove vertices from the graph. Finally, the system may step through the remaining vertices and repeat the identification, branching, and removing steps. In some embodiments the system may repeat these steps until the graph is empty. Finally, the system may identify the candidate maximum clique as the maximum clique in the graph.

The branching method on an identified vertex may proceed by identifying the reduced neighborhood graph of the vertex (i.e., a subgraph corresponding to the vertex and all its neighbors that have not been pruned from the graph yet). If the size of the identified reduced neighborhood graph is larger than the candidate maximum clique, the branching may proceed by finding the maximum core number within this reduced neighborhood graph. The branching method may then remove any vertices with core number smaller than the size of the candidate maximum clique from the reduced neighborhood graph. The branching method may then obtain a number of colors for a coloring of the reduced neighborhood subgraph. In some embodiments, this coloring may be a greedy or heuristic coloring.

If the number of colors is larger than the size of the candidate maximum clique, the branching method may then step through vertices and remove a respective vertex from the reduced neighborhood subgraph and add it to a candidate clique. If this candidate clique is not maximal, the branching method may branch further. If this candidate clique is maximal, and is larger than the previously-identified maximum clique, the branching method may identify the candidate clique as the new maximum clique.

Parallelization of Clique-Finding and Graph Compression

In some embodiments, the clique-finding method used in step 404 may be executed in parallel. If the clique-finding method is executed in serial, found cliques may be removed before searching for subsequent cliques, so there is no danger of cliques overlapping (i.e., sharing vertices). However, in parallel, the system may use additional methods to ensure that cliques found by different processors do not overlap (i.e., do not share vertices). The objective is to obtain an ordering of the vertices such that for any respective vertex, the maximum clique found by searching the respective vertex is non-overlapping with the clique found from searching the subsequent vertex. This ensures that if two vertices are searched in parallel, then both processors discover non-overlapping cliques that are unique.

In some embodiments, the system may perform a k-coloring, such as a greedy coloring, to find independent sets or color classes $\{S_1, \ldots, S_k\}$. Because two vertices in the same color class cannot be connected, distinct cliques centered at vertices in the same color class $S_i$ should be non-overlapping. This allows the cliques within a same color class to be found in parallel.

In some embodiments, the system chooses the independent set containing the maximum number of vertices in the largest k-core since the maximum clique typically arises from these vertices. Then the system may find the largest clique for each vertex in the chosen independent set, and add them to the set of cliques.

However, note that after discovery, cliques may initially be "implicitly" removed from the graph or simply marked as pruned, and later "explicitly" removed. Therefore, in order to provide a stronger guarantee of unique, non-overlapping cliques, in some embodiments the system may use a neighborhood coloring, also called a distance-two coloring, to assign vertices to processors. In a neighborhood coloring, any two adjacent vertices are assigned different colors, and their neighbors are also assigned different colors from each other. Therefore, two vertices in the same color class are non-adjacent, and their neighbors are also non-overlapping and non-adjacent. The independent sets are called neighborhood-independent sets, which means that their neighborhoods do not overlap.

Figure 7:
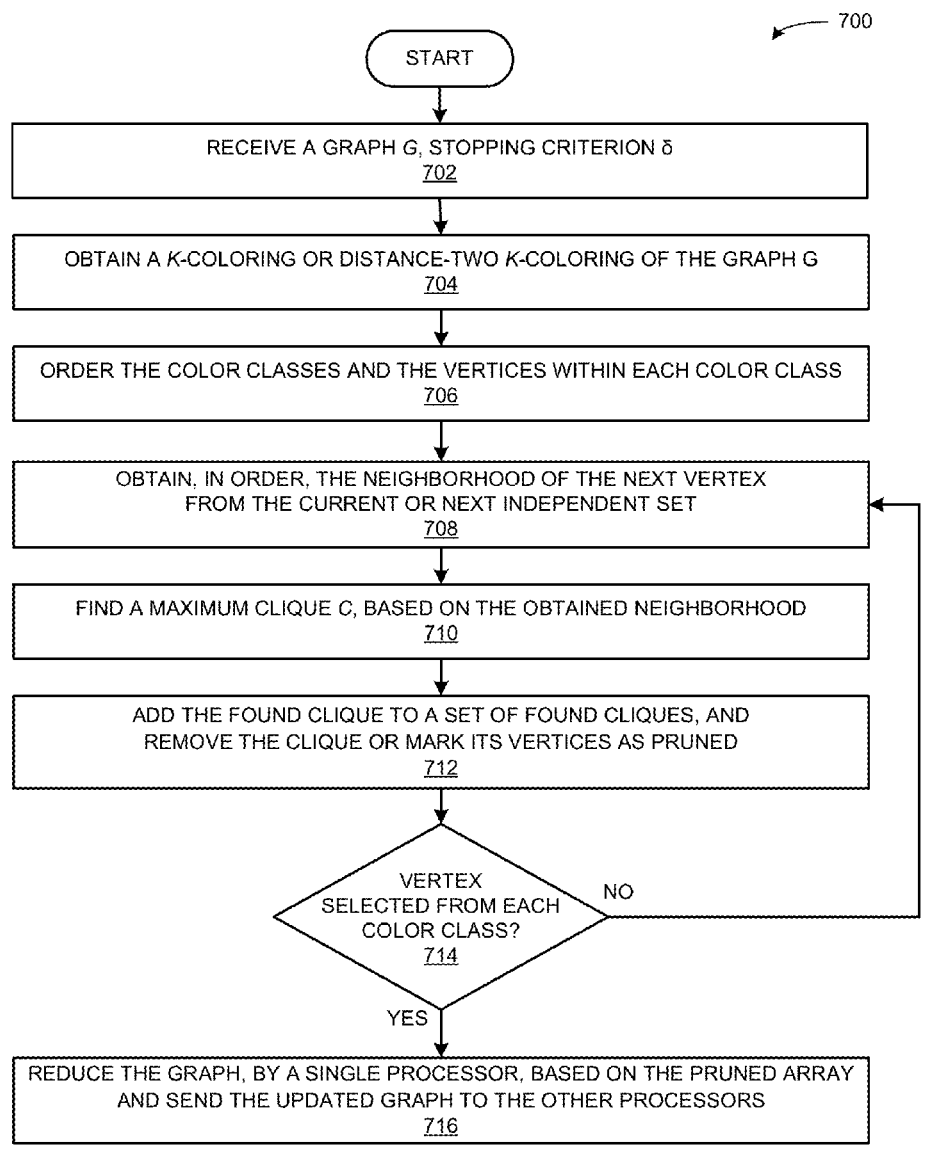
FIG. 7 illustrates exemplary modifications for parallel efficiency and accuracy to the method illustrated in FIG. 5 to find cliques and compress a graph.

FIG. 7 illustrates exemplary parallel modifications 700 to method 500 to find cliques and compress a graph. Note that many variations of this method are possible, and many steps are not required, and may depend on the application domain, constraints, and data.

Given an undirected graph, the system may obtain a k-coloring or a neighborhood coloring such that a respective color class contains vertices that are non-adjacent (operation 704). The system may then order the color classes (operation 706) such that the first-ordered color class maximizes some function (such as largest degree, number of triangles, sum of k-cores, etc.). The system may then order the vertices in each independent color class such that the next vertex to be selected from that color class maximizes some function (largest degree, etc.). The system may then cycle over each independent set in order, and choose the next vertex in order from that set (operation 708). The system may then obtain the neighborhood of the chosen vertex. The system may then use the neighborhood as input into a fast heuristic clique finder, and obtain the largest clique (operation 710). The system may then remove the obtained clique from the search (i.e., the clique's vertices may be removed from all independent sets). This removal may be done simply by marking the clique's vertices in an array of pruned vertices (operation 712), which can be checked in O(1) time. The system may then repeat the above steps by selecting a vertex from the next color class in order. The system may repeat this until a vertex is selected from each color class (operation 714). Afterwards, a single processor may reduce the graph using the pruned array, and may send this updated graph to the processors (operation 716). After each clique is found, it may be added to the set of found cliques (or may be written to a storage medium by a single processor). This process stops when there are no more cliques larger than the stopping criterion δ. Upon termination, the set of found cliques can be used to efficiently represent the graph in-memory, or for storing the graph to storage.

Exemplary Apparatus

Figure 8:
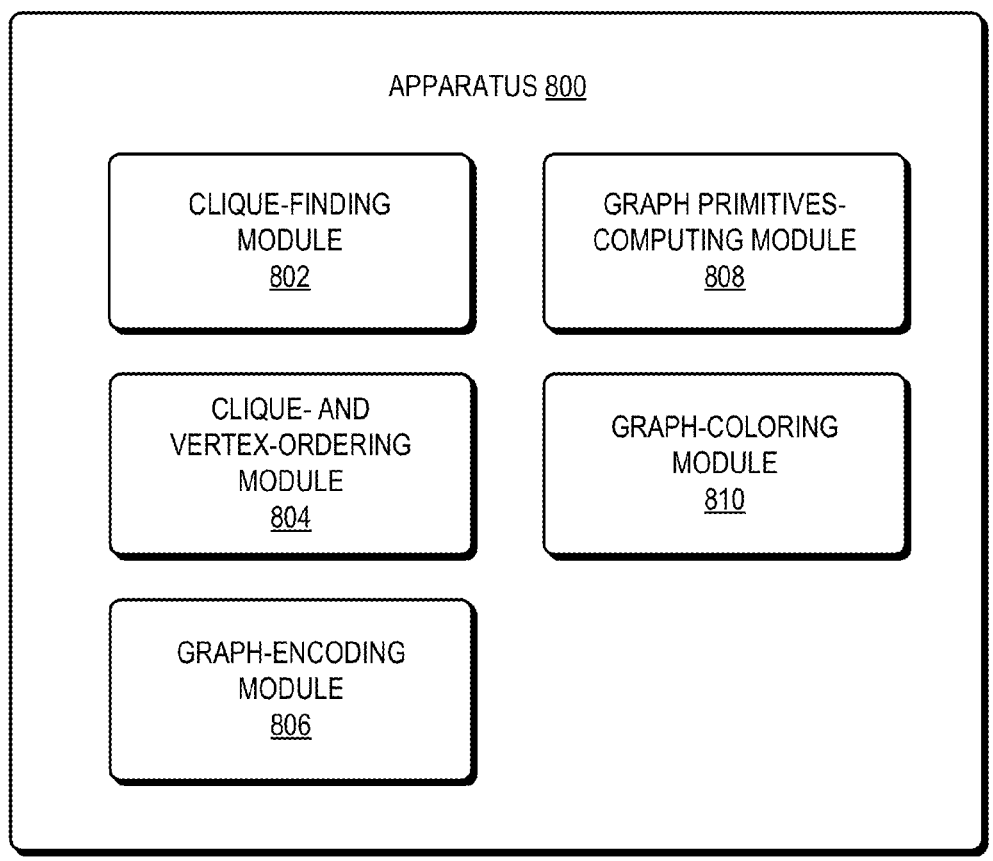
FIG. 8 presents a block diagram illustrating an exemplary apparatus for graph compression, in accordance with embodiments of the present invention.

FIG. 8 presents a block diagram illustrating an exemplary apparatus 800 that facilitates graph compression, in accordance with some embodiments. Apparatus 800 can comprise a plurality of modules which may communicate with one another via a wired or wireless communication channel. Apparatus 800 may be realized using one or more integrated circuits, and may include fewer or more modules than those shown in FIG. 8. Further, apparatus 800 may be integrated in a computer system, or realized as a separate device which is capable of communicating with other computer systems and/or devices. Specifically, apparatus 800 can comprise a clique-finding module 802, a clique- and vertex-ordering module 804, a graph-encoding module 806, a graph primitives-computing module 808, and a graph-coloring module 810. Note that apparatus 800 may also include additional modules not depicted in FIG. 8.

In some embodiments, clique-finding module 802 can find large cliques. Clique and vertex-ordering module 804 may order cliques and/or may order vertices to match the clique ordering. Graph-encoding module 806 may encode representations of a graph, compressed graph, or cliques. Graph primitives-computing module 808 may compute graph primitives, such as checking whether a vertex belongs to a clique, according to a compressed representation of a graph. Graph-coloring module 810 may obtain a k-coloring, greedy coloring, and/or neighborhood coloring of a graph or subgraph. Note that graph management module 202 illustrated in FIG. 2 may provide any and all functions of the various modules depicted in FIG. 8.

Exemplary System

Figure 9:
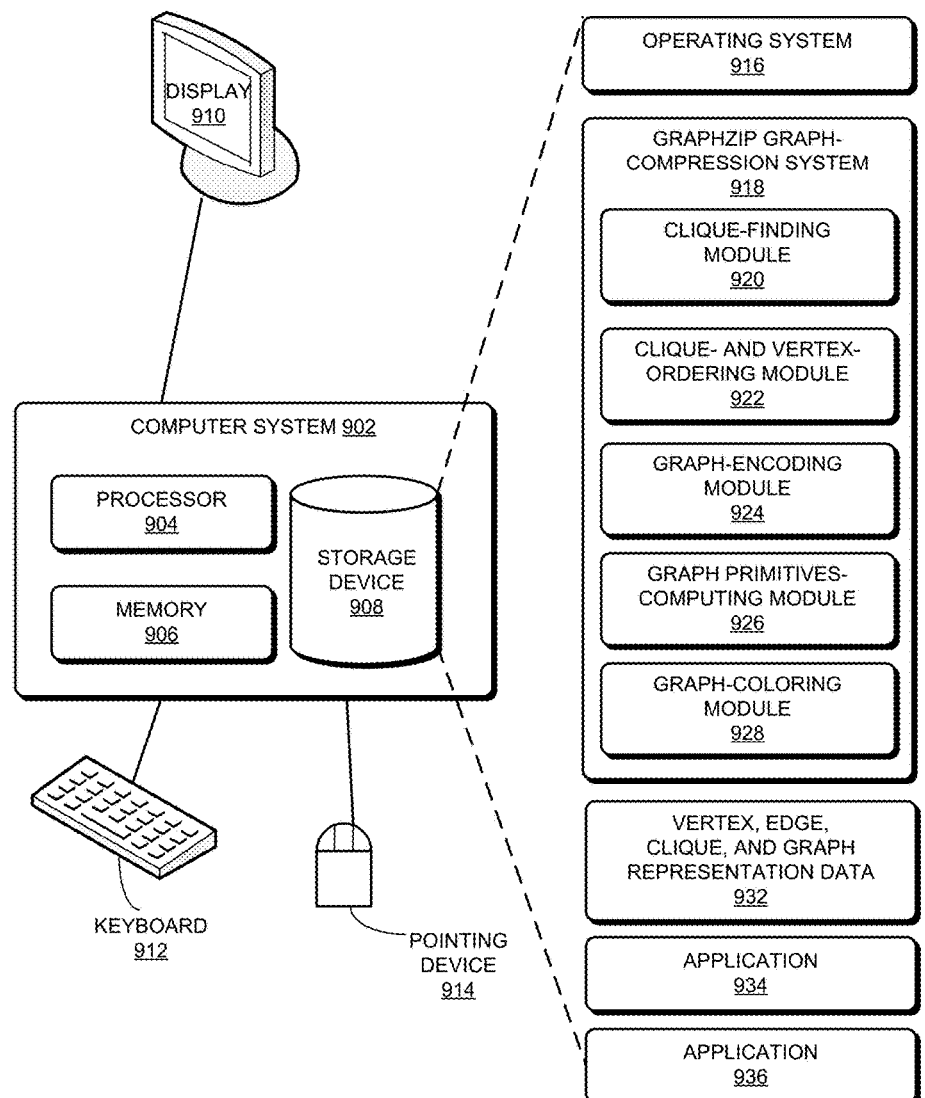
FIG. 9 presents a block diagram illustrating an exemplary computer system for graph compression, in accordance with embodiments of the present invention.

FIG. 9 illustrates an exemplary graph compression computer system 902, in accordance with some embodiments. In some embodiments, computer system 902 may be a server. In some embodiments, system 902 includes a processor 904, a memory 906, and a storage device 908. In some embodiments, 904 may include a set of processors. Storage device 908 may store a number of applications, such as applications 934 and 936, which may make use of graph compression according to embodiments of the present invention, and operating system 916. Storage device 908 also stores GraphZIP graph compression system 918 that includes a clique-finding module 920, a clique- and vertex-ordering module 922, a graph-encoding module 924, a graph primitives-computing module 926, and a graph-coloring module 928. System 902 may generate and copy the vertices and edges data to a memory section accessible to graph compression system 918. During operation, one or more applications, such as GraphZIP graph compression system 918, are loaded from storage device 908 into memory 906 and then executed by processor set 904. While executing the program, processor set 904 performs the aforementioned functions. System 902 may be coupled to an optional display 910, a keyboard 912, and a pointing device 914.

In some embodiments, clique-finding module 920 can find large cliques. Clique and vertex-ordering module 922 may order cliques and/or may order vertices to match the clique ordering. Graph-encoding module 924 may encode representations of a graph, compressed graph, or cliques. Graph primitives-computing module 926 may compute graph primitives, such as checking whether a vertex belongs to a clique, according to a compressed representation of a graph. Graph-coloring module 928 may obtain a k-coloring, greedy coloring, and/or neighborhood coloring of a graph or subgraph. Note that graph management module 202 illustrated in FIG. 2 may provide any and all functions of the various modules depicted in FIG. 9.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method for compressing a representation of a graph, comprising:

storing, in a non-transitory storage medium, a data structure representing a graph comprising vertices and edges;

maintaining a list of cliques of the graph;

identifying a maximum clique in the graph, wherein the maximum clique is a largest remaining fully-connected subset of vertices in the graph;

adding the identified clique to the list of cliques;

removing the identified clique from the graph; and in response to determining that the size of the identified maximum clique is below a threshold:
  ordering the cliques in the list of cliques;
  ordering a set of vertices belonging to a respective clique in the list of cliques;
  generating a compressed representation of the graph based on the ordered list of cliques and the ordered set of vertices of a respective clique in the list of cliques; and
  storing the compressed representation of the graph in the non-transitory storage medium.

2. The method of claim 1, wherein generating the compressed representation of the graph further comprises replacing, in the graph, a respective clique in the list of cliques with a pseudo-vertex.

3. The method of claim 1, wherein the set of vertices belonging to the cliques in the list of cliques is ordered such that:
  a first subset of vertices belonging to a first clique and a second subset of vertices belonging to a second clique of are contiguously ordered based on an order of the ordered list of cliques; and
  wherein generating the compressed representation of the graph comprises, for a respective clique in the ordered list of cliques, encoding an ordering index in a respective subset of vertices belonging to a respective clique in the ordered list of cliques.

4. The method of claim 1, wherein identifying the maximum clique comprises:
  ordering the vertices in the graph based on a k-core degeneracy value;
  choosing, based on the ordering, a first vertex;
  choosing a neighboring vertex connected to the first vertex; and
  adding the first and neighboring vertices to a candidate maximum clique.

5. The method of claim 1, further comprising:
  performing a first part of a graph-traversal or social-network computation by determining whether a first vertex and a second vertex are connected;
  determining whether an ordering index for the first vertex and an ordering index for the second vertex fall within a same subset of vertices belonging to a clique;
  performing, based on the determined connectivity between the first vertex and the second vertex, a second part of the graph-traversal or social-network computation; and
  generating, based on the graph-traversal or social-network computation, a recommendation for a user.

6. The method of claim 1, wherein identifying the maximum clique comprises:
  generating independent sets of vertices such that two vertices belonging to a same independent set have no common neighbors;
  ordering the independent sets of vertices such that a first independent set maximizes a degree function;
  assigning a first vertex from the first independent set to a first processor in a set of processors;
  choosing, by the first processor, one or more neighboring vertices connected to the first vertex; and
  adding, by the first processor, the first and the one or more neighboring vertices to a candidate maximum clique.

7. A non-transitory computer-readable storage medium storing instructions that when executed by a computer cause the computer to perform a method for compressing a representation of a graph, the method comprising:
  storing, in a non-transitory storage medium, a data structure representing a graph comprising vertices and edges;
  maintaining a list of cliques of the graph;
  identifying a maximum clique in the graph, wherein the maximum clique is a largest remaining fully-connected subset of vertices in the graph;
  adding the identified clique to the list of cliques;
  removing the identified clique from the graph; and
  in response to determining that the size of the identified maximum clique is below a threshold:
    ordering the cliques in the list of cliques;
    ordering a set of vertices belonging to a respective clique in the list of cliques;
    generating a compressed representation of the graph based on the ordered list of cliques and the ordered set of vertices of a respective clique in the list of cliques; and
    storing the compressed representation of the graph in the non-transitory storage medium.

8. The computer-readable storage medium of claim 7, wherein generating the compressed representation of the graph further comprises replacing, in the graph, a respective clique in the list of cliques with a pseudo-vertex.

9. The non-transitory computer-readable storage medium of claim 7, wherein the set of vertices belonging to the cliques in the list of cliques is ordered such that:
  a first subset of vertices belonging to a first clique and a second subset of vertices belonging to a second clique of are contiguously ordered based on an order of the ordered list of cliques; and
  wherein generating the compressed representation of the graph comprises, for a respective clique in the ordered list of cliques, encoding an ordering index in a respective subset of vertices belonging to a respective clique in the ordered list of cliques.

10. The non-transitory computer-readable storage medium of claim 7, wherein identifying the maximum clique comprises:
  ordering the vertices in the graph based on a k-core degeneracy value;
  choosing, based on the ordering, a first vertex;
  choosing a neighboring vertex connected to the first vertex; and
  adding the first and neighboring vertices to a candidate maximum clique.

11. The non-transitory computer-readable storage medium of claim 7, wherein the method further comprises:
  performing a first part of a graph-traversal or social-network computation by determining whether a first vertex and a second vertex are connected;
  determining whether an ordering index for the first vertex and an ordering index for the second vertex fall within a same subset of vertices belonging to a clique;
  performing, based on the determined connectivity between the first vertex and the second vertex, a second part of the graph-traversal or social-network computation; and generating, based on the graph-traversal or social-network computation, a recommendation for a user.

12. The non-transitory computer-readable storage medium of claim 7, wherein identifying the maximum clique comprises:
generating independent sets of vertices such that two vertices belonging to a same independent set have no common neighbors;
ordering the independent sets of vertices such that a first independent set maximizes a degree function;
assigning a first vertex from the first independent set to a first processor in a set of processors;
choosing, by the first processor, one or more neighboring vertices connected to the first vertex; and
adding, by the first processor, the first and the one or more neighboring vertices to a candidate maximum clique.

13. A computing system for compressing a representation of a graph, the system comprising:
a set of multiple processors, and
a non-transitory computer-readable medium coupled to the set of processors having instructions stored thereon that, when executed by the set of processors, cause the set of processors to perform a method for compressing a representation of a graph, the method comprising:
storing, in a non-transitory storage medium, a data structure representing a graph comprising vertices and edges;
maintaining a list of cliques of the graph;
identifying a maximum clique in the graph, wherein the maximum clique is a largest remaining fully-connected subset of vertices in the graph;
adding the identified clique to the list of cliques;
removing the identified clique from the graph; and
in response to determining that the size of the identified maximum clique is below a threshold:
ordering the cliques in the list of cliques;
ordering a set of vertices belonging to a respective clique in the list of cliques;
generating a compressed representation of the graph based on the ordered list of cliques and the ordered set of vertices of a respective clique in the list of cliques; and
storing the compressed representation of the graph in the non-transitory storage medium.

14. The computing system of claim 13, wherein generating the compressed representation of the graph further comprises replacing, in the graph, a respective clique in the list of cliques with a pseudo-vertex.

15. The computing system of claim 13, wherein the set of vertices belonging to the cliques in the list of cliques is ordered such that:
a first subset of vertices belonging to a first clique and a second subset of vertices belonging to a second clique of are contiguously ordered based on an order of the ordered list of cliques; and
wherein generating the compressed representation of the graph comprises, for a respective clique in the ordered list of cliques, encoding an ordering index in a respective subset of vertices belonging to a respective clique in the ordered list of cliques.

16. The computing system of claim 13, wherein identifying the maximum clique comprises:
ordering the vertices in the graph based on a k-core degeneracy value;
choosing, based on the ordering, a first vertex;
choosing a neighboring vertex connected to the first vertex; and
adding the first and neighboring vertices to a candidate maximum clique.

17. The computing system of claim 13, wherein the method further comprises:
performing a first part of a graph-traversal or social-network computation by determining whether a first vertex and a second vertex are connected;
determining whether an ordering index for the first vertex and an ordering index for the second vertex fall within a same subset of vertices belonging to a clique;
performing, based on the determined connectivity between the first vertex and the second vertex, a second part of the graph-traversal or social-network computation; and
generating, based on the graph-traversal or social-network computation, a recommendation for a user.

18. The computing system of claim 13, wherein identifying the maximum clique comprises:
generating independent sets of vertices such that two vertices belonging to a same independent set have no common neighbors;
ordering the independent sets of vertices such that a first independent set maximizes a degree function;
assigning a first vertex from the first independent set to a first processor in the set of multiple processors;
choosing, by the first processor, one or more neighboring vertices connected to the first vertex; and
adding, by the first processor, the first and the one or more neighboring vertices to a candidate maximum clique.

* * * * *